(12) United States Patent
Rappoport et al.

(10) Patent No.: US 10,109,232 B2
(45) Date of Patent: Oct. 23, 2018

(54) OPTICAL SYSTEM AND METHOD TO MIMIC ZERO-BORDER DISPLAY

(71) Applicant: Apple Inc., Cupertino, CA (US)

(72) Inventors: Benjamin Mark Rappoport, Los Gatos, CA (US); Fletcher R. Rothkopf, Los Altos, CA (US); John Patrick Ternus, Los Altos Hills, CA (US); Paul Stephen Drzaic, Morgan Hill, CA (US); Scott Andrew Myers, San Francisco, CA (US); Stephen Brian Lynch, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 88 days.

(21) Appl. No.: 15/150,278

(22) Filed: May 9, 2016

(65) Prior Publication Data
US 2016/0253965 A1 Sep. 1, 2016

Related U.S. Application Data

(62) Division of application No. 13/251,103, filed on Sep. 30, 2011.

(51) Int. Cl.
G09G 5/10 (2006.01)
G09G 3/3225 (2016.01)
(Continued)

(52) U.S. Cl.
CPC ............ *G09G 3/3225* (2013.01); *G09G 3/20* (2013.01); *G09G 3/2003* (2013.01); *G09G 3/30* (2013.01); *H01L 27/326* (2013.01); *H01L 51/5262* (2013.01); *G09G 2300/0408* (2013.01); *G09G 2300/0439* (2013.01);
(Continued)

(58) Field of Classification Search
CPC ... G09G 2300/0408; G09G 2300/0439; G09G 2300/0465; G09G 2310/0232; G09G 2320/0233; G09G 2320/0686; G09G 3/20; G09G 3/2003; G09G 3/30; G09G 3/3225;
(Continued)

(56) References Cited

U.S. PATENT DOCUMENTS 4,761,641 A * 8/1988 Schreiber ............... H04N 9/12
340/815.42
4,904,049 A 2/1990 Hegg
(Continued)

FOREIGN PATENT DOCUMENTS

CN 101162334 4/2008
CN 101188081 5/2008
(Continued)

Primary Examiner — Michael J Jansen, II
(74) Attorney, Agent, or Firm — Joseph F. Guihan

(57) ABSTRACT

A system and methods to extending the overall display area for a device. At or near the borders of a device, pixel pitch between adjacent pixels may be increased such that overall pixel placement may be provided closer to a border of a display of a device. In one embodiment, pixel drive circuitry may be located in the spacing between adjacent pixels. Additionally, various optical systems and techniques may be utilized to provide an appearance of a lack of a border around the display such as decreasing the size of border pixels, overdriving the border pixels, or utilizing a light pipe on a surface above the border pixels.

15 Claims, 6 Drawing Sheets

(51) Int. Cl.
*G09G 3/20* (2006.01)
*G09G 3/30* (2006.01)
*H01L 51/52* (2006.01)
*H01L 27/32* (2006.01)

(52) U.S. Cl.
CPC ............. *G09G 2300/0465* (2013.01); *G09G 2310/0232* (2013.01); *G09G 2320/0233* (2013.01); *G09G 2320/0686* (2013.01); *H01L 27/3216* (2013.01); *H01L 27/3218* (2013.01); *H01L 51/524* (2013.01)

(58) Field of Classification Search
CPC ............. H01L 27/3216; H01L 27/3218; H01L 27/326; H01L 51/524; H01L 51/5262
See application file for complete search history.

(56) References Cited

U.S. PATENT DOCUMENTS

| | | | | |
|---|---|---|---|---|
| 5,552,911 | A * | 9/1996 | Okada | G02F 1/133514 349/106 |
| 5,574,836 | A * | 11/1996 | Broemmelsiek | G06F 3/012 345/427 |
| 5,751,272 | A * | 5/1998 | Silverbrook | G02F 1/133514 345/694 |
| 5,777,704 | A * | 7/1998 | Selker | G06F 1/1637 349/1 |
| 5,793,345 | A * | 8/1998 | Silverbrook | G02F 1/133514 345/695 |
| 5,805,136 | A * | 9/1998 | Silverbrook | G02F 1/134336 345/43 |
| 6,199,995 | B1 * | 3/2001 | Umemoto | G02B 6/0038 362/23.13 |
| 6,417,523 | B1 * | 7/2002 | Swanson | H01L 27/3209 257/81 |
| 6,433,846 | B1 * | 8/2002 | Omar | G02F 1/133504 349/112 |
| 6,585,386 | B1 * | 7/2003 | Yano | G02B 6/0038 362/614 |
| 6,903,716 | B2 * | 6/2005 | Kawabe | G09G 3/342 345/100 |
| 6,917,368 | B2 * | 7/2005 | Credelle | G09G 3/3607 345/589 |
| 6,927,908 | B2 | 8/2005 | Stark | |
| 7,177,097 | B2 * | 2/2007 | Lim | G02B 6/0008 359/709 |
| 7,187,825 | B2 * | 3/2007 | Lim | G02B 6/0008 385/15 |
| 7,248,271 | B2 * | 7/2007 | Credelle | G09G 3/3607 345/694 |
| 7,362,478 | B2 * | 4/2008 | Mangerson | G02B 26/02 358/471 |
| 7,385,574 | B1 * | 6/2008 | Van de Ven | G09G 3/32 257/89 |
| 7,551,372 | B2 | 6/2009 | Xun et al. | |
| 7,592,971 | B2 * | 9/2009 | Chang | G02F 1/13336 345/1.3 |
| 7,629,945 | B2 * | 12/2009 | Baudisch | G06F 3/1438 345/1.3 |
| 7,663,715 | B2 | 2/2010 | Jin et al. | |
| 7,710,528 | B2 * | 5/2010 | Hasegawa | G02F 1/13452 349/149 |
| 7,719,756 | B2 * | 5/2010 | Jung | G02F 1/167 345/107 |
| 7,733,436 | B2 * | 6/2010 | Suzuki | G02B 6/0091 349/58 |
| 7,856,161 | B2 | 12/2010 | Tabor | |
| 7,864,203 | B1 * | 1/2011 | Fear | G09G 5/003 345/428 |
| 7,889,215 | B2 * | 2/2011 | Brown Elliott | G06T 3/4015 345/426 |
| 7,916,156 | B2 * | 3/2011 | Brown Elliott | G06T 3/4015 345/426 |
| 8,035,760 | B2 * | 10/2011 | Kim | G02F 1/134309 349/12 |
| 8,085,216 | B2 | 12/2011 | Miller | |
| 8,094,261 | B2 * | 1/2012 | Fujita | G02B 6/0086 349/58 |
| 8,212,742 | B2 * | 7/2012 | Chang | G02F 1/133524 345/1.3 |
| 8,237,718 | B2 * | 8/2012 | Lum | G09G 3/3622 345/100 |
| 8,264,433 | B2 * | 9/2012 | Nakai | G09G 3/342 345/84 |
| 8,300,165 | B2 * | 10/2012 | Yokoyama | G02F 1/136213 345/90 |
| 8,368,729 | B2 | 2/2013 | Watanabe | |
| 8,373,630 | B2 * | 2/2013 | Odoi | G02F 1/133524 345/102 |
| 8,376,601 | B2 * | 2/2013 | Yashiro | G02B 6/0026 362/606 |
| 8,395,569 | B2 * | 3/2013 | Min | H01L 27/3253 257/88 |
| 8,405,692 | B2 * | 3/2013 | Brown Elliott | G02F 1/133514 345/694 |
| 8,411,026 | B2 * | 4/2013 | Sampsell | G02B 26/001 345/102 |
| 8,421,820 | B2 * | 4/2013 | Brown Elliott | G09G 3/20 345/204 |
| 8,451,405 | B2 * | 5/2013 | Roth | G09G 3/3607 345/694 |
| 8,472,114 | B2 | 6/2013 | Watanabe | |
| 8,477,439 | B2 * | 7/2013 | Imai | G02B 27/2242 359/834 |
| 8,502,816 | B2 * | 8/2013 | Butler | G06F 3/041 345/419 |
| 8,502,844 | B1 * | 8/2013 | Fear | G09G 5/003 345/698 |
| 8,531,623 | B2 * | 9/2013 | Watanabe | G02F 1/133526 349/58 |
| 8,541,934 | B2 | 9/2013 | Watanabe et al. | |
| 8,605,238 | B2 * | 12/2013 | Matsui | G02F 1/133512 349/106 |
| 8,619,210 | B2 * | 12/2013 | Watanabe | G09F 9/30 345/102 |
| 8,659,504 | B2 * | 2/2014 | Imamura | G09G 3/3611 345/1.3 |
| 8,690,414 | B2 | 4/2014 | Tomotoshi et al. | |
| 8,692,737 | B2 | 4/2014 | Watanabe et al. | |
| 8,723,824 | B2 * | 5/2014 | Myers | H04M 1/0268 345/173 |
| 8,730,425 | B2 * | 5/2014 | Ji | G02F 1/133308 349/58 |
| 8,749,729 | B2 * | 6/2014 | Sasaki | G02B 6/0021 349/65 |
| 8,766,885 | B2 * | 7/2014 | Van de Ven | G09G 3/32 345/82 |
| 8,773,477 | B2 * | 7/2014 | Erinjippurath | G09G 3/3413 315/294 |
| 8,780,015 | B2 * | 7/2014 | Watanabe | G02F 1/13336 345/1.3 |
| 8,797,234 | B2 * | 8/2014 | Watanabe | G02F 1/13336 345/1.3 |
| 8,797,305 | B2 * | 8/2014 | Imamura | G02F 1/13336 345/207 |
| 8,810,698 | B2 * | 8/2014 | Hiramoto | H01L 27/14621 348/294 |
| 8,830,277 | B2 * | 9/2014 | Higashi | G09G 3/3426 345/204 |
| 8,830,695 | B2 * | 9/2014 | Grespan | H01L 23/04 361/702 |
| 8,847,246 | B2 * | 9/2014 | Ryu | H01L 27/3276 257/88 |
| 8,879,022 | B2 * | 11/2014 | Oh | G02F 1/133308 349/58 |
| 8,890,047 | B2 * | 11/2014 | Solhusvik | H01L 27/14634 250/208.1 |
| 8,928,567 | B2 * | 1/2015 | Huang | G02F 1/1323 345/87 |

(56) References Cited

U.S. PATENT DOCUMENTS

| | | | |
|---|---|---|---|
| 8,953,338 B2* | 2/2015 | Wu | G02F 1/1333 174/255 |
| 8,976,324 B2* | 3/2015 | Yang | G02F 1/133524 349/112 |
| 9,041,620 B2* | 5/2015 | Watanabe | G02F 1/13336 340/1.1 |
| 9,075,258 B2* | 7/2015 | Watanabe | G02F 1/13336 |
| 9,972,670 B2* | 5/2018 | Yamazaki | H01L 27/3276 |
| 2001/0046365 A1 | 11/2001 | Bohle et al. | |
| 2002/0000967 A1 | 1/2002 | Huston et al. | |
| 2002/0167531 A1 | 11/2002 | Baudisch | |
| 2003/0169247 A1* | 9/2003 | Kawabe | G09G 3/342 345/204 |
| 2004/0051944 A1* | 3/2004 | Stark | G02F 1/13336 359/448 |
| 2004/0095617 A1* | 5/2004 | Mangerson | G02B 26/02 358/484 |
| 2004/0174375 A1* | 9/2004 | Credelle | G09G 3/3607 345/589 |
| 2005/0134600 A1* | 6/2005 | Credelle | G09G 3/3607 345/589 |
| 2005/0135741 A1* | 6/2005 | Lim | G02B 6/0008 385/31 |
| 2006/0007054 A1* | 1/2006 | Chang | G02F 1/13336 345/1.3 |
| 2006/0007369 A1 | 1/2006 | Jin et al. | |
| 2006/0077544 A1 | 4/2006 | Stark | |
| 2006/0158746 A1* | 7/2006 | Lim | G02B 6/0008 359/709 |
| 2006/0207145 A1* | 9/2006 | Kim | G02F 1/133308 40/700 |
| 2007/0045640 A1* | 3/2007 | Erchak | B82Y 20/00 257/98 |
| 2007/0046851 A1* | 3/2007 | Fujita | G02B 6/0086 349/58 |
| 2007/0176950 A1* | 8/2007 | Brown Elliott | G02F 1/133514 345/694 |
| 2008/0079863 A1* | 4/2008 | Jung | G02B 6/0086 349/58 |
| 2008/0165316 A1* | 7/2008 | Hasegawa | G02F 1/13452 349/149 |
| 2008/0180923 A1* | 7/2008 | Grespan | H01L 23/04 361/748 |
| 2008/0218660 A1* | 9/2008 | Suzuki | G02B 6/0091 349/65 |
| 2008/0231567 A1* | 9/2008 | Van de Ven | G09G 3/32 345/83 |
| 2008/0232751 A1* | 9/2008 | Tabor | G02B 6/08 385/116 |
| 2008/0291354 A1* | 11/2008 | Oh | G02F 1/133308 349/58 |
| 2008/0309633 A1 | 12/2008 | Hotelling et al. | |
| 2009/0027427 A1* | 1/2009 | Takasuka | G09G 3/3611 345/698 |
| 2009/0046108 A1* | 2/2009 | Brown Elliott | G06T 3/4015 345/603 |
| 2009/0059366 A1 | 3/2009 | Imai | |
| 2009/0085831 A1* | 4/2009 | Odoi | G02F 1/133524 345/1.3 |
| 2009/0096948 A1* | 4/2009 | Yokoyama | G02F 1/136213 349/39 |
| 2009/0102862 A1* | 4/2009 | Miller | G06F 3/1446 345/634 |
| 2009/0103191 A1 | 4/2009 | Xun et al. | |
| 2009/0135214 A1* | 5/2009 | Suzuki | G09G 5/00 345/698 |
| 2009/0185095 A1* | 7/2009 | Kim | G02F 1/134309 349/48 |
| 2009/0207475 A1* | 8/2009 | Jung | G02F 1/167 359/296 |
| 2009/0243980 A1* | 10/2009 | Nakai | G09G 3/342 345/84 |
| 2009/0309810 A1* | 12/2009 | Chang | G02F 1/13336 345/1.3 |
| 2010/0073272 A1* | 3/2010 | Yamazaki | G02F 1/13454 345/90 |
| 2010/0073593 A1* | 3/2010 | Sasaki | B29D 11/00 349/58 |
| 2010/0110048 A1* | 5/2010 | Min | H01L 27/3246 345/204 |
| 2010/0149208 A1* | 6/2010 | Brown Elliott | G06T 3/4015 345/603 |
| 2010/0157577 A1* | 6/2010 | Montgomery | G02B 6/0018 362/97.2 |
| 2010/0214509 A1* | 8/2010 | Sasaki | G02B 6/0021 349/65 |
| 2010/0238090 A1* | 9/2010 | Pomerantz | G02F 1/13336 345/1.3 |
| 2010/0246210 A1* | 9/2010 | Yashiro | G02B 6/0026 362/606 |
| 2010/0259566 A1* | 10/2010 | Watanabe | G02B 3/08 345/690 |
| 2011/0025594 A1 | 2/2011 | Watanabe | |
| 2011/0037929 A1* | 2/2011 | Roth | G09G 3/3607 349/106 |
| 2011/0096108 A1* | 4/2011 | Brown Elliott | G06T 3/4015 345/694 |
| 2011/0102302 A1 | 5/2011 | Watanabe et al. | |
| 2011/0109535 A1 | 5/2011 | Watanabe et al. | |
| 2011/0109622 A1 | 5/2011 | Son et al. | |
| 2011/0128463 A1* | 6/2011 | Ji | G02F 1/133308 349/58 |
| 2011/0164076 A1* | 7/2011 | Lee | G09G 3/3406 345/691 |
| 2011/0164200 A1* | 7/2011 | Watanabe | G02F 1/13336 349/58 |
| 2011/0234869 A1* | 9/2011 | Hiramoto | H01L 27/14621 348/294 |
| 2011/0234949 A1* | 9/2011 | Matsui | G02F 1/133512 349/106 |
| 2011/0242686 A1 | 10/2011 | Watanabe | |
| 2011/0249021 A1* | 10/2011 | Yoshida | G09G 3/20 345/606 |
| 2011/0255301 A1 | 10/2011 | Watanabe | |
| 2011/0279426 A1* | 11/2011 | Imamura | G02F 1/13336 345/207 |
| 2011/0279487 A1* | 11/2011 | Imamura | G09G 3/3611 345/690 |
| 2011/0279755 A1* | 11/2011 | Nittou | A63F 13/08 349/77 |
| 2011/0285934 A1 | 11/2011 | Watanabe | |
| 2011/0291119 A1* | 12/2011 | Ryu | H01L 27/3276 257/88 |
| 2011/0316867 A1* | 12/2011 | Lum | G09G 3/3622 345/549 |
| 2012/0008340 A1* | 1/2012 | Tomotoshi | G02F 1/13336 362/616 |
| 2012/0013649 A1* | 1/2012 | Higashi | G09G 3/3426 345/690 |
| 2012/0026216 A1* | 2/2012 | Brown Elliott | G09G 3/20 345/694 |
| 2012/0038571 A1* | 2/2012 | Susani | G06F 3/0416 345/173 |
| 2012/0049718 A1 | 3/2012 | Watanabe | |
| 2012/0050342 A1* | 3/2012 | Huang | G02F 1/1323 345/690 |
| 2012/0062575 A1* | 3/2012 | Sampsell | G02B 26/001 345/520 |
| 2012/0062607 A1* | 3/2012 | Erinjippurath | G09G 3/3413 345/690 |
| 2012/0081874 A1* | 4/2012 | Wu | G02F 1/1333 361/807 |
| 2012/0139897 A1* | 6/2012 | Butler | G06F 3/041 345/419 |
| 2012/0236483 A1* | 9/2012 | Watanabe | G02F 1/13336 361/679.01 |
| 2012/0293744 A1* | 11/2012 | Watanabe | G02F 1/133504 349/62 |

(56) References Cited

U.S. PATENT DOCUMENTS

| | | | |
|---|---|---|---|
| 2013/0068929 A1* | 3/2013 | Solhusvik | H01L 27/14634 250/208.1 |
| 2013/0076609 A1* | 3/2013 | Inada | G09G 3/3648 345/88 |
| 2013/0076649 A1* | 3/2013 | Myers | H04M 1/0268 345/173 |
| 2013/0082901 A1* | 4/2013 | Watanabe | G02F 1/13336 345/1.3 |
| 2013/0083080 A1* | 4/2013 | Rappoport | G09G 3/20 345/690 |
| 2014/0016071 A1* | 1/2014 | Yang | G02F 1/133524 349/106 |
| 2014/0092028 A1 | 4/2014 | Prest et al. | |
| 2014/0092346 A1 | 4/2014 | Yang et al. | |
| 2016/0253965 A1* | 9/2016 | Rappoport | G09G 3/20 345/694 |

FOREIGN PATENT DOCUMENTS

| | | |
|---|---|---|
| CN | 101339342 | 1/2009 |
| EP | 2306437 | 6/2011 |
| EP | 2423906 | 2/2012 |
| EP | 2439582 | 11/2012 |
| JP | 60227232 | 11/1985 |
| JP | 2006139058 | 6/2006 |
| KR | 10-2000-020849 | 4/2000 |
| WO | 200242838 | 5/2002 |
| WO | 2009122691 | 10/2009 |
| WO | 2010055671 | 5/2010 |
| WO | 2010070871 | 6/2010 |
| WO | 2010122781 | 10/2010 |
| WO | 2011093243 | 8/2011 |

\* cited by examiner

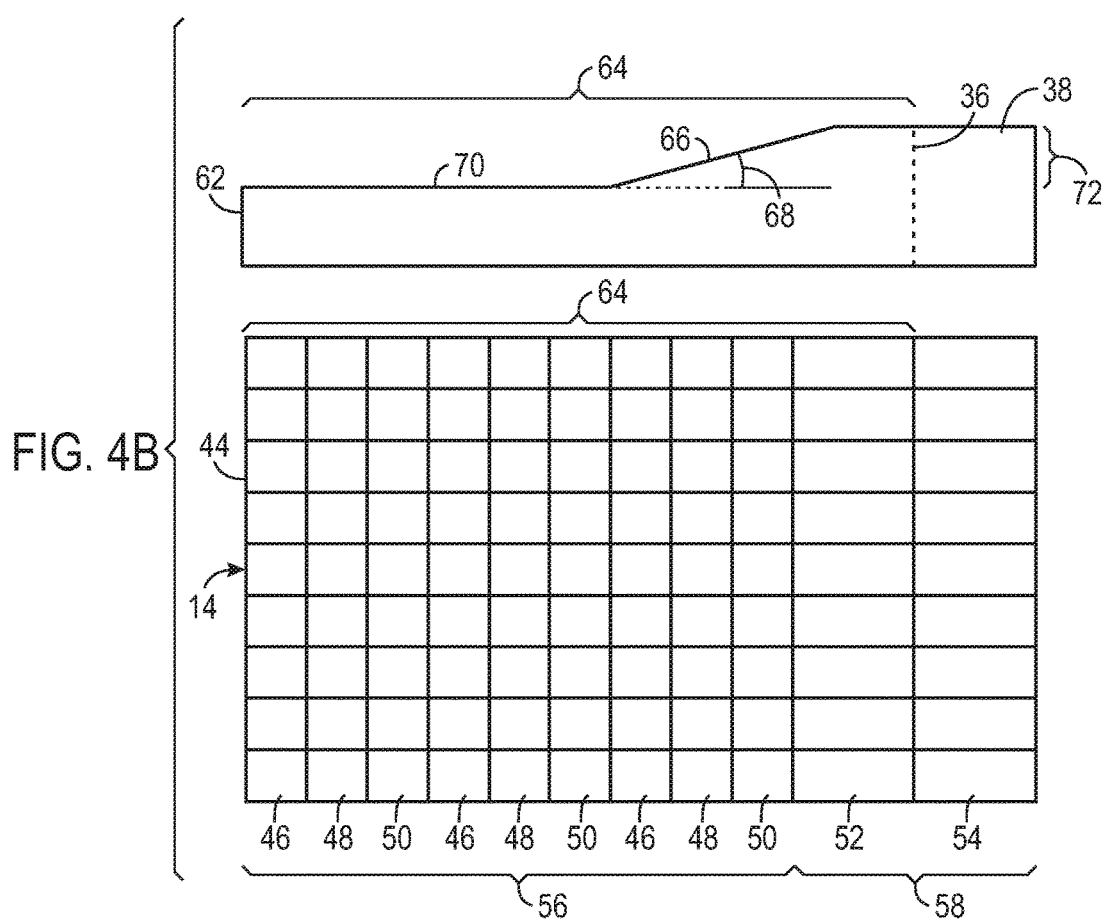

OPTICAL SYSTEM AND METHOD TO MIMIC ZERO-BORDER DISPLAY

This application is a division of U.S. patent application Ser. No. 13/251,103, filed Sep. 30, 2011, which is hereby incorporated by reference herein in its entirety. This application claims the benefit of and claims priority to U.S. patent application Ser. No. 13/251,103, filed Sep. 30, 2011.

BACKGROUND

The present disclosure relates generally to electronic displays and, more particularly, to increasing overall visible area for an organic light emitting diode (OLED) display.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Flat panel displays, such as liquid crystal displays (LCDs) organic light emitting diode (OLED) displays, are commonly used in a wide variety of electronic devices, including such electronic devices as televisions, computers, and handheld devices (e.g., cellular telephones, audio and video players, gaming systems, and so forth). Such display panels typically provide a flat display in a relatively thin package that is suitable for use in a variety of electronic goods. In addition, such devices typically use less power than comparable display technologies, making them suitable for use in battery-powered devices or in other contexts where it is desirable to reduce power usage.

Electronic displays typically include a border around the display. This border may be utilized to conceal, for example, drive circuitry used to operate the display. However, use of this border reduces the overall visible space available to display images. Accordingly, it would be beneficial to implement a system that increases the overall usable space for a display by reducing the impact of borders around the display.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Systems and methods are disclosed that extending the overall visible display area for an electronic device. One technique for extending the overall viewable area of an electronic device includes increasing pixel pitch (i.e., the distance between adjacent pixels) in border regions of the electronic device. In this manner, drive circuitry elements may be interspersed between pixel elements of the device in the border region to increase the overall viewing area of a display of the device. Another technique may include utilizing a light pipe to transmit light generated in an active pixel area of the display of the electronic device to an area that does not generate light, for example, over the area of the display containing the drive circuitry. Further techniques may include adjusting the size and or intensity of pixels in a border region adjacent, for example, drive circuitry in an effort to extend the overall perceived display area of the electronic device.

BRIEF DESCRIPTION OF THE DRAWINGS

Various aspects of this disclosure may be better understood upon reading the following detailed description and upon reference to the drawings in which:

FIG. 4B is a top view of an organic light emitting diode (OLED) display of the electronic device of FIG. 1, with a second perceived active area, in accordance with an embodiment;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Present embodiments relate to techniques for efficiently increasing the perceived display area of a display for an electronic device. These techniques may include increasing pixel pitch (i.e., the distance between adjacent pixels) in border regions of the electronic device and utilizing the empty space between pixels to include drive circuitry. That is, drive circuitry elements may be interspersed between pixel elements of the device in the border region of the device to increase the overall viewing area of a display of the device.

Another embodiment may include utilizing a light pipe to transmit light generated in an active pixel area of the display of the electronic device to an area that does not generate light. For example, light may be transmitted via the light pipe to an area of the display containing the drive circuitry. Additional embodiments may include adjusting the size and or intensity of pixels in a border region adjacent to, for example, drive circuitry, in an effort to extend the overall perceived display area of the electronic device.

Figure 1:
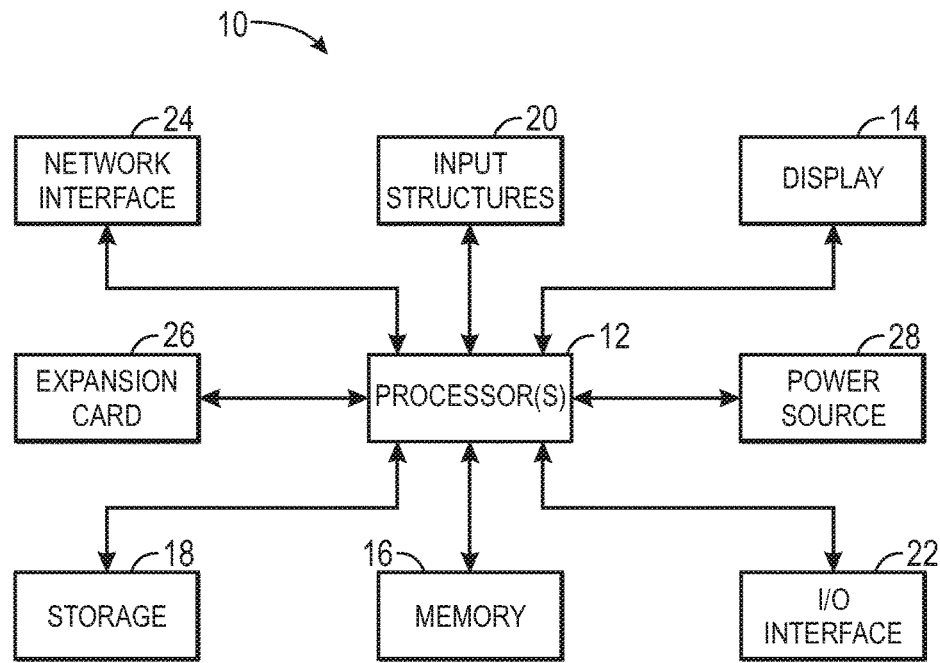
FIG. 1 is a block diagram of an electronic device capable of performing the techniques disclosed herein, in accordance with an embodiment.

With the foregoing in mind, FIG. 1 represents a block diagram of an electronic device 10 employing an organic light emitting diode (OLED) display 14 employing a greater surface area as a result of, for example, reduced bordering around the display 14. Among other things, the electronic device 10 may include the processor(s) 12, the display 14, memory 16, nonvolatile storage 18, input structures 20, an input/output (I/O) interface 22, network interface(s) 24, and/or an expansion card 26. In alternative embodiments, the electronic device 10 may include more or fewer components than those listed above In general, the processor(s) 12 may govern the operation of the electronic device 10. The processor(s) 12 may provide the processing capability to execute the operating system, programs, user and application interfaces, and any other functions of the electronic device 10. The processor(s) 12 may include one or more microprocessors, such as one or more "general-purpose" microprocessors, one or more special-purpose microprocessors and/or ASICS, or some combination of such processing components. For example, the processor(s) 12 may include one or more reduced instruction set (RISC) processors, as well as graphics processors, video processors, audio processors and/or related chip sets.

The instructions or data to be processed by the processor(s) 12 may be stored in a computer-readable medium, such as a memory 16. Such a memory 16 may be provided as a volatile memory, such as random access memory (RAM), and/or as a non-volatile memory, such as read-only memory (ROM). The memory 16 may store a variety of information and may be used for various purposes. For example, the memory 16 may store firmware for the electronic device 10 (such as a basic input/output instruction or operating system instructions), various programs, applications, or routines executed on the electronic device 10, user interface functions, processor functions, and so forth. In addition, the memory 16 may be used for buffering or caching during operation of the electronic device 10.

The components of electronic device 10 may further include other forms of computer-readable media, such as a non-volatile storage 18, for persistent storage of data and/or instructions. The non-volatile storage 18 may include flash memory, a hard drive, or any other optical, magnetic, and/or solid-state storage media. The non-volatile storage 18 may be used, for example, to store firmware, data files, software, wireless connection information, and any other suitable data.

In some embodiments, based on instructions loaded into the memory 16 from the nonvolatile storage 18, the processor(s) 12 may respond to user touch gestures input via the display 14. The display 14 may be an organic light emitting diode (OLED) display. Accordingly, the display 14 may be used to display various images generated by the device 10. Additionally, in certain embodiments of the electronic device 10, the display 14 may be provided in conjunction with touch-sensitive element, such as a touch screen, that may be used as part of the control interface for the device 10. In this manner, the display 14 may represent one of the input structures 20 by providing interactive functionality, thus allowing a user to navigate the displayed interface by touching the display 10.

Other input structures 20 may include, for example, buttons, sliders, switches, control pads, keys, knobs, scroll wheels, keyboards, mice, touchpads, and so forth. Accordingly, the input structures 20 may include various devices and/or circuitry by which user input or feedback is provided to the processor(s) 12. For example, the input structures 20 may allow a user to navigate a displayed user interface or application interface. In this way, the displayed interface may provide interactive functionality, allowing a user to navigate the displayed interface by touching the display 10.

The electronic device may also include an I/O interface 22. The I/O interface 22 may enable the electronic device 10 to transmit data to and receive data from other electronic devices 10 and/or various peripheral devices. The I/O interface 22 may thus include ports configured to connect to a variety of external devices, such as a power source, headset or headphones, external keyboards, mice, or other electronic devices (such as handheld devices and/or computers, printers, projectors, external displays, modems, docking stations, and so forth). The I/O interface 22 may support any interface type, such as a universal serial bus (USB) port, a video port, a serial connection port, an IEEE-1394 port, and/or an Ethernet or modem port.

Additionally, the electronic device 10 may include a network interface 24 that may include a network controller or a network interface card (NIC). Thus, in one embodiment, the network interface 24 may be a wireless NIC providing wireless connectivity over any 802.11 standard or any other suitable wireless networking standard. The network interface 24 may allow the electronic device 10 to communicate over a network, such as a personal area network (PAN) (e.g., Bluetooth), a local area network (LAN) (e.g., Wi-Fi), a wide area network (WAN) (e.g., 3G or 4G).

The embodiment of the electronic device 10 illustrated in FIG. 1 may also include one or more card or expansion slots. The card slots may be configured to receive an expansion card 26 that may be used to add functionality, such as additional memory, I/O functionality, or networking capability, to the electronic device 10. Such an expansion card 26 may connect to the device through any type of suitable connector, and may be accessed internally or external to the housing of the electronic device 10. For example, in one embodiment, the expansion card 26 may be flash memory card, such as a SecureDigital (SD) card, mini- or microSD, CompactFlash card, Multimedia card (MMC), or the like.

Additionally, the electronic device 10 may also include a power source 28. In one embodiment, the power source 28 may be one or more batteries, such as a lithium-ion polymer battery or other type of suitable battery. The battery may be user-removable or may be secured within the housing of the electronic device 10, and may be rechargeable. Additionally, the power source 28 may include AC power, such as provided by an electrical outlet, and the electronic device 10 may be connected to the power source 28 via a power adapter. This power adapter may also be used to recharge one or more batteries of the electronic device 10, if present.

Figure 2:
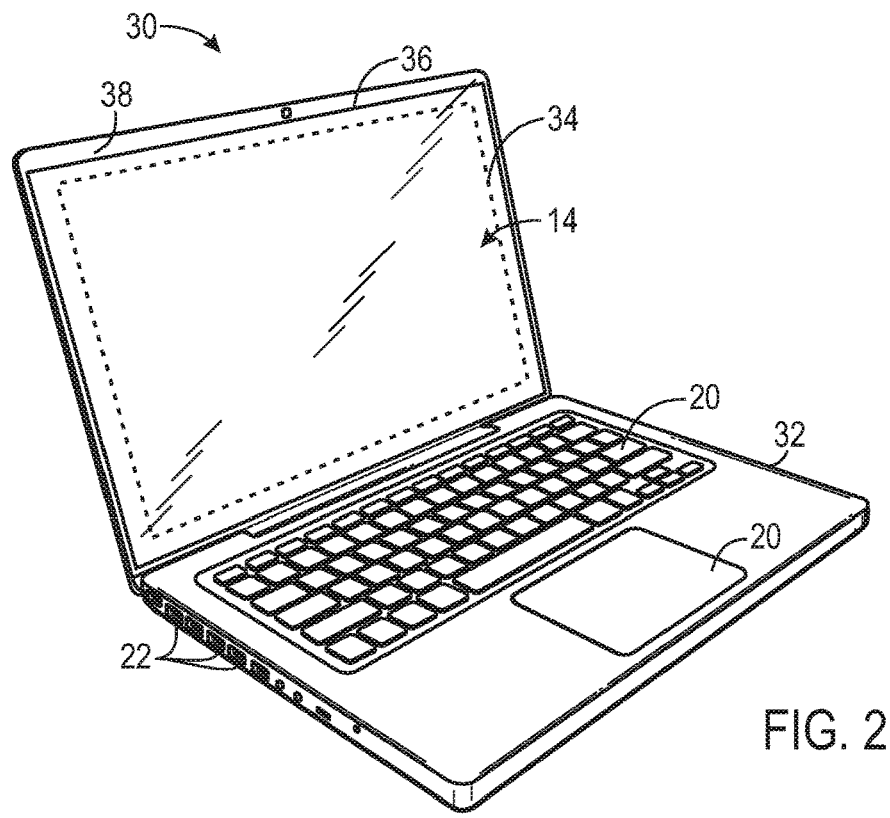
FIG. 2 is an embodiment of the electronic device of FIG. 1 in the form of a computer, in accordance with an embodiment.
Figure 3:
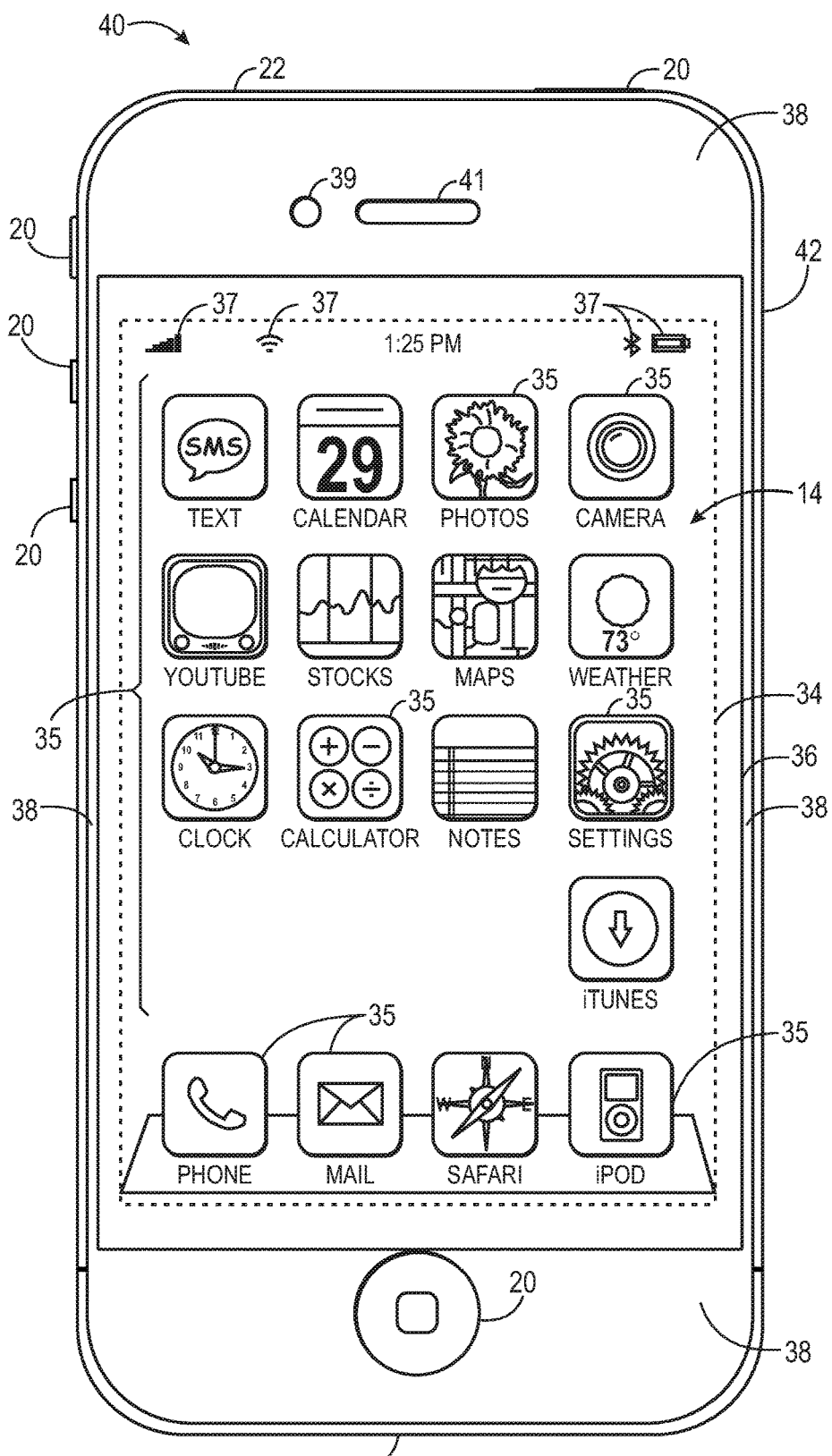
FIG. 3 is an embodiment of the electronic device of FIG. 1, in the form of a handheld device, in accordance with an embodiment.

One embodiment of the electronic device 10 of FIG. 1 is illustrated in FIG. 2. Specifically, FIG. 2 illustrates the electronic device 10 in the form of a computer 30. The computer 30 may be generally portable (such as a laptop, a notebook computer, a tablet computer, a netbook, and so forth) and may be a model of a MacBook®, MacBook® Pro, MacBook Air®, iMac®, Mac® mini, or Mac Pro® available from Apple Inc. of Cupertino, Calif. In another embodiment, the electronic device 10 may be a tablet computing device, such as an iPad® available from Apple Inc. By way of example, a laptop computer 30 is illustrated in FIG. 3 and represents an embodiment of the electronic device 10 in accordance with one embodiment of the present disclosure. Among other things, the computer 30 includes a housing 32, the display 14 (such as the depicted OLED display panel), input structures 20, and input/output interfaces 22. In one embodiment, the input structures 20 (such as a keyboard and/or touchpad) may enable interaction with the computer 30, such as to start, control, or operate a graphical user interface (GUI) or applications running on the computer 30. For example, a keyboard and/or touchpad may allow a user to navigate a user interface or application interface displayed on the display 14. Also as depicted, the computer 30 may also include various I/O interfaces 22, such as a USB port or other ports suitable for connecting to other electronic devices. In addition, the computer 30 may include network connectivity, memory, and storage capabilities, as described with respect to FIG. 1.

As illustrated, the computer 30 may have a perceived active area 34 for the display 14 on which a user may perceive images as being displayed. As will be discussed in greater detail below with respect to FIGS. 4A-6B, techniques may be implemented in the computer 30 to increase the size of this perceived active area 34 to perceived active area 36. That is, techniques will be discussed to generate the perceived active area 36, effectively shrinking the border area 38 surrounding the display 14 and, thus, providing a user an effective larger display 14 area.

In addition to computers, such as the depicted laptop computer 30 of FIG. 2, the electronic device 10 may take other forms, such as the electronic handheld device 40 depicted in FIG. 3. It should be noted that while the depicted handheld device 40 is provided in the context of a cellular telephone, other types of handheld devices (such as media players for playing music and/or video, a camera or video recorder, personal data organizers, handheld game platforms, and/or combinations of such devices) may also be suitably provided as the electronic device 10. Further, a suitable handheld device 40 may incorporate the functionality of more than one of these types of devices, such as a device that incorporates the functionality of two or more of a media player, a cellular phone, a gaming platform, a personal data organizer, and so forth. For example, in the depicted embodiment, the handheld device 40 is in the form of a cellular telephone that may provide various additional functionalities (such as the ability to take pictures, record audio and/or video, listen to music, play games, and so forth). Moreover, as discussed with respect to the electronic device 10 of FIG. 1, the handheld device 40 may allow a user to connect to and communicate through the Internet or through other networks, such as local or wide area networks. Additionally, the handheld device 40 also may communicate with other devices using short-range connections, such as Bluetooth and/or near field communication (NFC). By way of example, the handheld device 40 may be a model of an iPod® or iPhone® available from Apple Inc.

The handheld device 40 may include a display 14 that may include an OLED display panel. The display 14 may be used to display a graphical user interface (GUI), which may allows a user to interact with the handheld device 40. For example, the GUI may include graphical elements that represent applications and functions of the electronic device such as icons 35 and/or indicators 37. The icons 35 may be selected and/or activated via a touch screen included in the display 10, or may be selected by a user input structure 20, such as a wheel or button. The handheld device may further include other elements, such as a camera 39 and a speaker 41.

The handheld device 40 may also include an enclosure 42 or body that protects the interior components of the handheld electronic device 40 from physical damage and shields them from electromagnetic interference. The enclosure may be formed from any suitable material such as plastic, metal or a composite material and may allow certain frequencies of electromagnetic radiation to pass through to wireless communication circuitry within the handheld device 40 to facilitate wireless communication.

The handheld device 40 also includes user input structures 20, through which a user may interface with the device. Each user input structure 20 may be configured to help control a device function of the handheld device 40 when actuated. For example, in a cellular telephone implementation, one or more of the input structures 20 may be configured to invoke a "home" screen or menu to be displayed, to toggle between a sleep and a wake mode, to silence a ringer for a cell phone application, to increase or decrease a volume output, and so forth. The handheld device 40 may additionally include various I/O interfaces 22 that allow connection of the handheld device 40 to external devices. For example, one I/O interface 22 may be a port that allows the transmission and reception of data or commands between the handheld device 40 and another electronic device, such as the computer 30. Such a port may be a proprietary port from Apple Inc. or may be an open standard I/O port. Another I/O interface 22 may include a headphone jack to allow a headset to connect to the handheld device 40.

Furthermore, similar to the computer 30 illustrated in FIG. 2, the handheld device 40 may have a perceived active area 34 for the display 14 on which a user may perceive images as being displayed. As will be discussed in greater detail below with respect to FIGS. 4A-6B, techniques may be implemented in the handheld device 40 to increase the size of this perceived active area 34 to perceived active area 36. That is, techniques will be discussed to generate the perceived active area 36, effectively shrinking the border area 38 surrounding the display 14 and, thus, providing a user an effective larger display 14 area.

With the foregoing discussion in mind, it may be appreciated that an electronic device 10 in either the form of a computer 30 or a handheld device 40 may be provided with a display 14 that includes an OLED display panel or layer. Such a display 14 may be utilized to display the respective operating system and application interfaces running on the electronic device 10 and/or to display data, images, or other visual outputs associated with an operation of the electronic device 10. Furthermore, techniques to increase the perceived size of this display 14 will be discussed below.

Figure 4A:
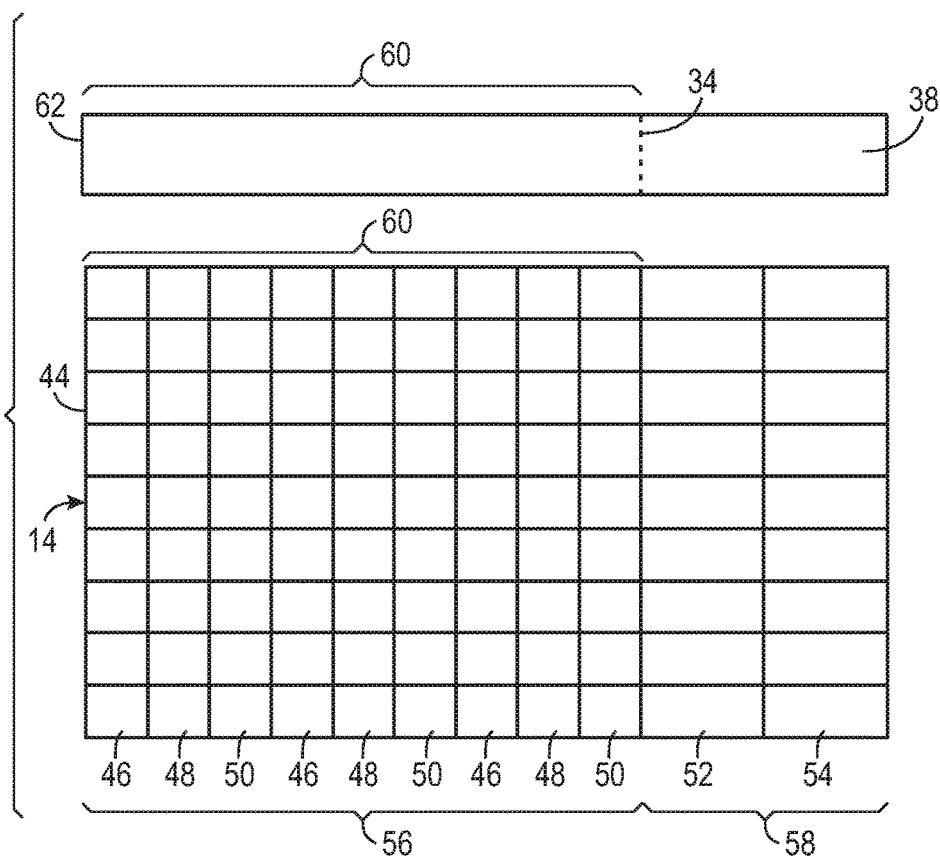
FIG. 4A is a top view of an organic light emitting diode (OLED) display of the electronic device of FIG. 1, with a first perceived active area, in accordance with an embodiment.

Turning now to FIG. 4A, one embodiment of a display 14 for use in an electronic device 10, as discussed above, is depicted. FIG. 4A illustrates a top view of the display 14 of the electronic device 10, which may be an organic light emitting diode (OLED). The display 14 may be made up of pixels 44 disposed in a pixel array or matrix. In such an array, each pixel 44 may be defined by the intersection of rows and columns, represented here columns 46, 48, and 50. In one embodiment, pixels 44 in column 46 may represent red pixels (i.e., pixels 44 that are used to generate red light), pixels 44 in column 48 may represent green pixels (i.e., pixels 44 that are used to generate green light), and pixels 44 in column 48 may represent blue pixels (i.e., pixels 44 that are used to generate blue light). Although only eighty one pixels 44 are shown for purposes of simplicity, it should be understood that in an actual implementation, each pixel array may include thousands, hundreds of thousands, or millions of such pixels 44. Moreover, in some embodiments, three pixels 44 of three different colors (e.g., red, green, and blue) may be stacked atop each other rather than side-by-side.

Thus, as shown in the present embodiment, each pixel 44 includes an organic light emitting diode (OLED) capable of emitting light of a particular color. Each unit pixel 44 may be electrically connected drive circuitry, represented in column 52. This drive circuitry may select any particular pixel on a given line (horizontal selection) and column (vertical selection). Thus, the drive circuitry in column 52 may operate to activate and/or provide a brightness control signal to any given pixel 44 in the array. In conjunction, as various pixels 44 are activated, an overall image is generated on the display 14.

In addition to drive circuitry in column 52, the display 14 includes an inactive border area 54. This inactive border 54 area may correspond to a mask, which may be a dark area through which no light may be emitted. Thus, the display 14 may include an active area 56 that includes each of the pixels 44 in the array (e.g., light emitting elements), as well as a passive area 58 of the display 14 that includes no light generating elements. As such, the viewable area 60 of the display 14 (i.e., the area of the display that is illuminated to a user) corresponds to the size of the active area 56. This is further shown in FIG. 4A with respect to a side view of a protective covering surface 62 that may cover the display 14 and extend to, for example, the enclosure 42 or body that protects the interior components of the handheld electronic device 40. In one embodiment, this protective covering surface 62 may be touch screen such as a glass-based capacitive touch panel. As illustrated in FIG. 4A, the viewable area 60 corresponds to the perceived active area 34 illustrated in FIGS. 2 and 3. Past the viewable area 60, the border 38 (i.e., non-illuminated portion of display 14) is present.

FIG. 4B illustrates a technique to extend the perceived active area 34 of FIG. 4A to the perceived active area 36 illustrated in FIG. 4B. FIG. 4B illustrates the display 14 with pixels 44 aligned in columns 46, 48, and 50, as previously discussed with respect to FIG. 4A. Additionally, FIG. 4B illustrates drive circuitry, represented in column 52 and the inactive border area 54 as previously discussed with respect to FIG. 4A. As such, the display 14 in FIG. 4B has an identical active area 56 and passive area 58 as illustrated in FIG. 4A. However, the viewable area 64 of the display 14 in FIG. 4B differs from the viewable area 60 in FIG. 4A.

As illustrated in FIG. 4B, the viewable area 64 of the display 14 (i.e., the area of the display that is illuminated to a user) covers both the pixels 44 and the drive circuitry in column 52. This extension of the viewable area 64 with respect to viewable area 60 may be accomplished by modification of the protective covering surface 62. As illustrated in FIG. 4B, the protective covering surface 62 may include a flat area 70 that extends over a portion of the pixel array. This flat area 70 may cover, for example, approximately 50%, 60%, 66%, 70%, 75% or more of the pixel array of the display 14. Extending from this flat area 70 of the protective covering surface 62 is a light pipe 66. The light pipe 66 may function to transport or distribute light from the pixel array across, for example, the drive circuitry area in column 52 of the display 14 to generate a perceived active area 36 corresponding to the perceived active area 36 illustrated in FIGS. 2 and 3.

In one embodiment, the light pipe 66 may extend the thickness of the protective covering surface 62 by an amount 72 equal to, for example, approximately 10%, 20%, 25%, 30%, 33%, 40%, 45%, 50% or more of the thickness of the protective covering surface 62 in flat area 70. Additionally, the light pipe may extend from the flat area 70 of the protective covering surface 62 at an angle 68 of, for example, approximately 5%, 10%, 15%, 20%, 25%, 30%, 33%, 40% or more with respect to the flat area 70. In this manner, through the use of the light pipe 66, the viewable area 64 of the display 14 covers both the pixels 44 and the drive circuitry in column 52, thus generating a perceived active area 36 greater than perceived active area 34 of FIG. 4A.

Figure 5A:
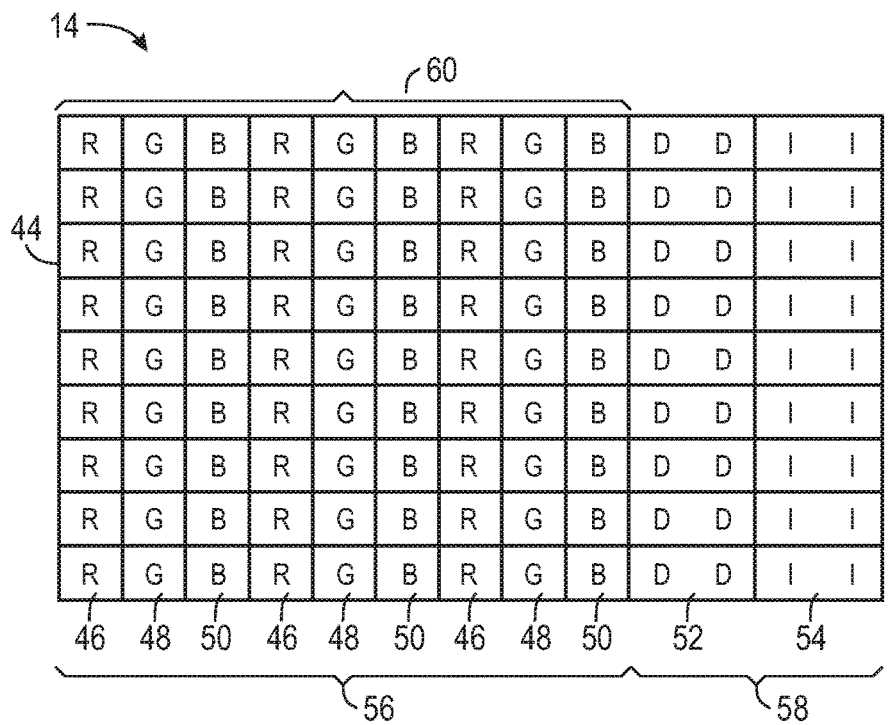
FIG. 5A is second top view of an organic light emitting diode (OLED) display of the electronic device of FIG. 1, with a first perceived active area, in accordance with an embodiment.
Figure 5B:
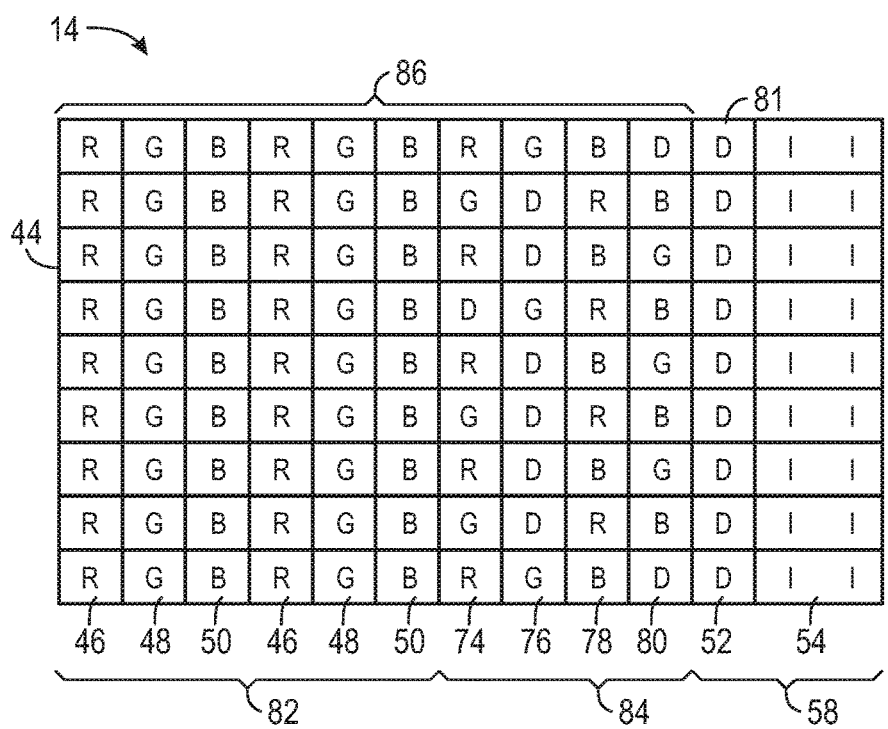
FIG. 5B is a second top view of an organic light emitting diode (OLED) display of the electronic device of FIG. 1, with a second perceived active area, in accordance with an embodiment.

FIGS. 5A and 5B illustrate another technique to extend the perceived active area 34 of an electronic device 10 to a perceived active area 36. FIG. 5A illustrates a display 14 of the electronic device 10 that includes pixels 44 aligned in columns 46, 48, and 50, drive circuitry, represented in column 52, and an inactive border area 54 as previously discussed with respect to FIG. 4A. In this configuration, the display 14 of FIG. 5A has an active area 56, passive area 58, and viewable area 60 similar to those illustrated in FIG. 4A. A technique to extend this viewable area 60 of FIG. 5A is illustrated in FIG. 5B.

FIG. 5B illustrates a configuration of the display 14 that extends the viewable area 60 (and, thus, the perceived active area 34 of the display 14) of FIG. 5A. FIG. 5B illustrates the display 14 with pixels 44 aligned in columns 46, 48, and 50, as previously discussed with respect to FIG. 5A. These columns 46, 48, and 50 may be separated from both the drive circuitry in column 52 and the inactive border area 54 by an active border area 84, represented by columns 74, 76, 78, and 80. That is, an active area 82 includes pixels 44 aligned in columns 46, 48, and 50, while the active border area 84 includes pixels 44 intermixed with drive circuitry elements 81. In this manner the pixel pitch (i.e., the distance between pixels) at the border area (the area of the display adjacent the drive circuitry in column 52 and the inactive border area 54) is increased relative to the pixel pitch of the pixels 44 in the active area 82 (i.e., a central area of the display 14 adjacent the border area) such that a pixel 44 may be spaced apart from a neighboring pixel 44 and separated therefrom by a drive circuit element.

In the illustrated example in FIG. 5B, it should be noted that the equivalent of columns 46, 48, 50, and drive circuitry column 52 are interlaced to generate columns 74, 76, 78, and 80. That is, red, green, and blue pixels 44 are interspersed drive circuitry elements 81. Moreover, it is noted that during the interspersing of the pixels 44 and drive elements 81, no pixel 44 in any of the columns 74, 76, 78, or 80 is placed directly above, below, to the left, or to the right of a similarly colored pixel 44. By avoiding placement of adjacent similar colored pixels 44, undesirable visual artifacts may be minimized. Moreover, while one particular configuration of the interspersed of pixels 44 with drive circuitry elements 81 is illustrated in FIG. 5B, it should be noted that other configurations are contemplated.

As illustrated in FIG. 5B, by interspersing drive circuitry in columns 74, 76, 78, and 80 of the active border area 84, a viewable area 86 may be generated. It should be noted that this viewable area 86 is larger than the viewable area 60 of FIG. 5A. That is, while viewable area 60 of FIG. 5A corresponds to perceived active area 34 of the display 14, the viewable area 86 of FIG. 5B corresponds to perceived active area 36 of the display 14. In this manner, a user viewing the display 14 of FIG. 5B will perceive the display to be larger than a user viewing the display 14 of FIG. 5A.

Figure 6A:
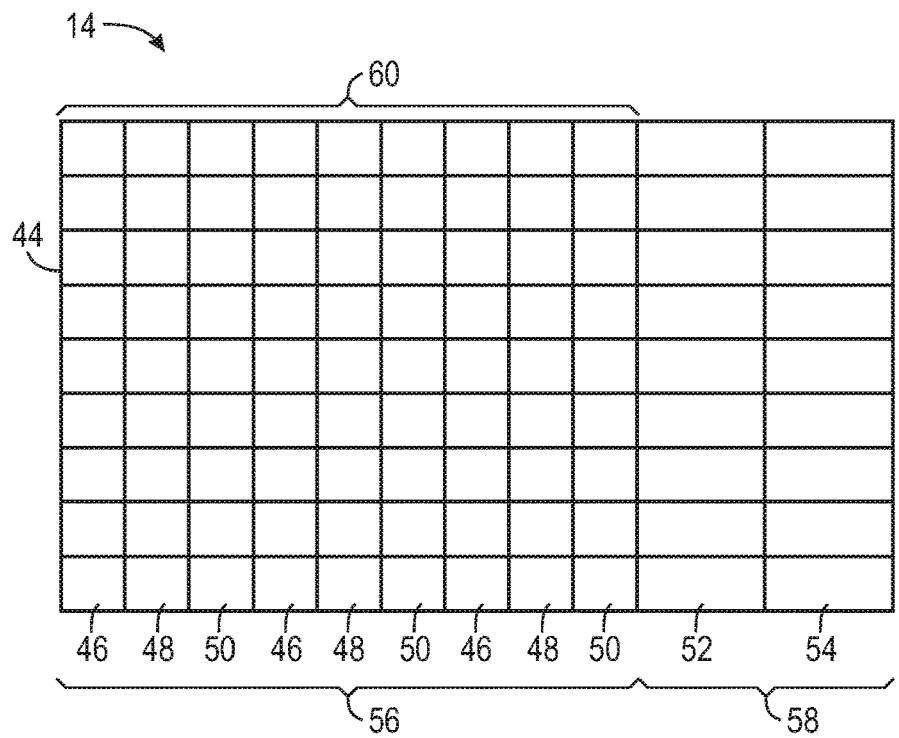
FIG. 6A is a third top view of an organic light emitting diode (OLED) display of the electronic device of FIG. 1, with a first perceived active area, in accordance with an embodiment.
Figure 6B:
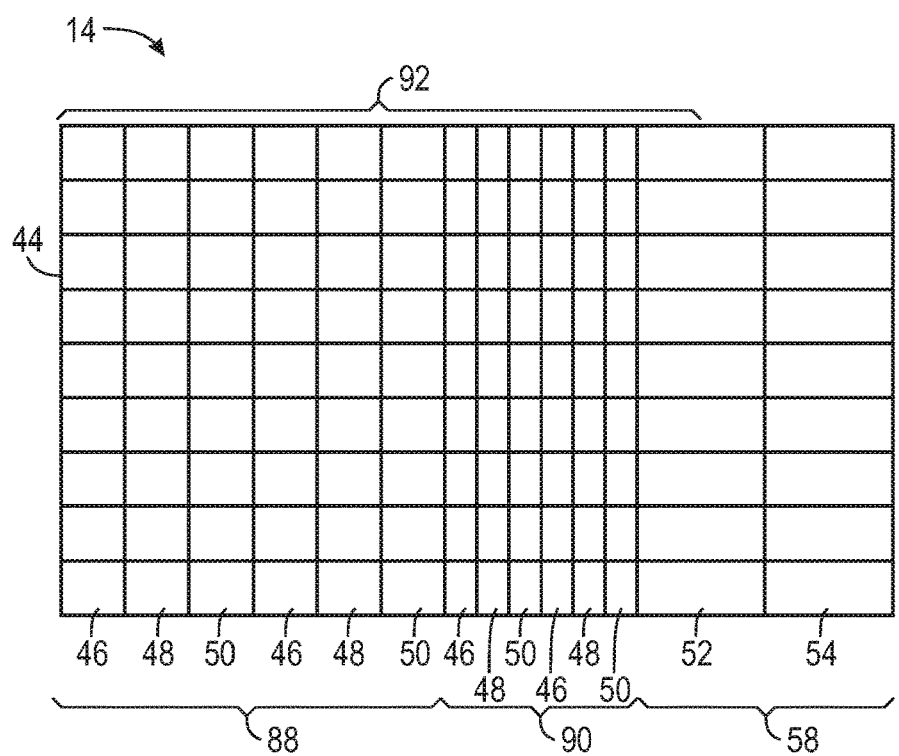
FIG. 6B is a third top view of an organic light emitting diode (OLED) display of the electronic device of FIG. 1, with a second perceived active area, in accordance with an embodiment.

FIGS. 6A and 6B illustrate an additional technique to extend the perceived active area 34 of an electronic device 10 to a perceived active area 36. FIG. 6A illustrates a display 14 of the electronic device 10 that includes pixels 44 aligned in columns 46, 48, and 50, drive circuitry, represented in column 52, and an inactive border area 54 as previously discussed with respect to FIGS. 4A and 5A. In this configuration, the display 14 of FIG. 6A has an active area 56, passive area 58, and viewable area 60 similar to those illustrated in FIGS. 4A and 5A. A technique to extend this viewable area 60 of FIG. 6A is illustrated in FIG. 6B.

FIG. 6B illustrates a configuration of the display 14 that extends the viewable area 60 (and, thus, the perceived active area 34 of the display 14) of FIG. 6A. FIG. 6B illustrates the display 14 with pixels 44 aligned in columns 46, 48, and 50, as previously discussed with respect to FIG. 6A. These columns 46, 48, and 50 may be grouped into an active area 88 and a condensed active area 90, as illustrated in FIG. 6B. In one embodiment, the pixels 44 in the active area 88 are identically sized to the pixels in active area 56 of FIG. 6A. In contrast, the pixels 44 in the condensed active area 90 may be smaller than the pixels in the active area 88 of FIG. 6B. In one embodiment, the pixels 44 in the condensed active area 90 may be equal to, for example, approximately 20%, 25%, 30%, 33%, 40%, 45%, 50%, 60%, 70%, 75% the size of the pixels 44 in the active area 88 of FIG. 6B. In addition, the pixels 44 in the condensed active area 90 of FIG. 6B may be driven at a greater intensity than the pixels 44 in the active area 88. For example, the pixels 44 in the condensed active area 90 may driven at an intensity equal to approximately 110%, 120%, 125%, 130%, 133%, 140%, 145%, 150%, 160%, 170%, 175%, 200%, 250%, or 300% of the intensity that the pixels 44 in the active area 88 of FIG. 6B are driven. That is, the pixels 44 in the condensed active area 90 (i.e., a border area of the display 14 adjacent the drive circuitry) may be sized differently and driven differently than pixels 44 in the active area 88 (i.e., a central area of the display 14 adjacent the border area).

Accordingly, through the use of smaller pixels 44 driven at a greater intensity in the condensed active area 90, viewable area 92 may be generated. It should be noted that this viewable area 92 is larger than the viewable area 60 of FIG. 6A. That is, while viewable area 60 of FIG. 5A corresponds to perceived active area 34 of the display 14, the viewable area 92 of FIG. 5B corresponds to perceived active area 36 of the display 14. In this manner, a user viewing the display 14 of FIG. 6B will perceive the display to be larger than a user viewing the display 14 of FIG. 6A.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A display, comprising:
an array of pixels arranged in rows and columns that form an active area of the display and an active border area of the display, the active area comprising a plurality of adjacent pixels with a first pixel pitch; and
drive circuitry in a passive area of the display, wherein the drive circuitry includes a plurality of drive circuitry elements that provide control signals to the pixels in the array, wherein at least one of the drive circuitry elements is interposed between two or more adjacent pixels a given column of the array with a second pixel pitch that is greater than the first pixel pitch, wherein the given column is in an active border area of the display in which a plurality of the drive circuitry elements are interspersed with a plurality of the pixels in the array, wherein the active border area of the display is interposed between the active area and the passive area and includes two or more adjacent pixels with the first pixel pitch, and wherein the drive circuitry elements are formed only in the active border area and the passive area without extending into the active area and include one or more drive circuitry elements that are not interposed between adjacent pixels.

2. The display defined in claim 1, wherein the passive area includes an inactive border area, the display further comprising:
a mask that covers the inactive border area such that no light is emitted from the inactive border area.

3. The display defined in claim 2, wherein the pixels comprise light-emitting diodes, wherein the passive area is free of the light-emitting diodes, and wherein the passive area comprises a column of drive circuitry elements interposed between the active border area and the inactive border area.

4. The display defined in claim 1, wherein the display emits light from the active area and from the active border area.

5. The display defined in claim 1, wherein the two or more adjacent pixels in the active border area are each of different colors.

6. The display defined in claim 1, wherein each of the pixels comprises a light-emitting diode.

7. The electronic device defined in claim 1, wherein in the active border area, no pixel of a given color is directly above, below, to the left, or to the right of another pixel of the given color.

8. A display having an active area, a passive area, and an active border area interposed between the active area and the passive area, the display comprising:
a plurality of pixels comprising:
a plurality of adjacent pixels in the active area that have a first pixel pitch;
two or more adjacent pixels in the active border area that have a second pixel pitch that is greater than the first pixel pitch;
drive circuitry for the display, wherein the drive circuitry comprises a drive circuitry element interposed between the two or more adjacent pixels in the active border area, and wherein the drive circuitry is formed only in the active border area and the passive area without extending into the active area;
two or more adjacent pixels in the active border area that have the first pixel pitch; and
one or more drive circuitry elements in the active border area that are not interposed between two adjacent pixels.

9. The display defined in claim 8, wherein the active area and the border area emit light, and wherein the passive area does not emit light.

10. The display defined in claim 8, wherein each of the pixels in the array comprises an organic light-emitting diode.

11. The display defined in claim 8, wherein the drive circuitry provides control signals to the pixels in the array.

12. An electronic device, comprising:

a display having an active area, a passive area, and an active border area interposed between the active area and the passive area, the display comprising a plurality of pixels, wherein a first distance between two or more neighboring pixels in the active border area is greater than a second distance between a plurality of neighboring pixels in the active area, and wherein a third distance between two or more neighboring pixels in the active border area is equal to the second distance; and drive circuitry in the passive area that is configured to drive the plurality of pixels, wherein a drive circuit element of the drive circuitry is located in the first distance between the two or more neighboring pixels in the active border area, wherein one or more drive circuit elements are located in the active border area and are not between two or more neighboring pixels, and wherein the drive circuitry is formed exclusively in the active border area and in the passive area.

13. The electronic device defined in claim 12, wherein each pixel of the plurality of pixels in the active border area of the display having a neighboring pixel directly adjacent thereto in a common row is configured to generate light of a different color than its neighboring pixel.

14. The electronic device defined in claim 12, wherein each pixel of the plurality of pixels in the active border area of the display having a neighboring pixel directly adjacent thereto in a common column is configured to generate light of a different color than its neighboring pixel.

15. The electronic device defined in claim 12, wherein the display comprises an organic light emitting diode display.

* * * * *